US008740639B2

(12) United States Patent
Grice et al.

(10) Patent No.: US 8,740,639 B2
(45) Date of Patent: *Jun. 3, 2014

(54) STRUCTURE FOR REMOVABLE PROCESSOR SOCKET

(71) Applicant: International Business Machines Corporation, Armonk, NY (US)

(72) Inventors: Jonathan K. Grice, Raleigh, NC (US); Emil P. Parker, Youngsville, NC (US); Shelby H. Williams, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/969,860

(22) Filed: Aug. 19, 2013

(65) Prior Publication Data
US 2013/0330953 A1 Dec. 12, 2013

Related U.S. Application Data

(63) Continuation of application No. 13/449,708, filed on Apr. 18, 2012, now Pat. No. 8,545,258.

(51) Int. Cl.
H01R 13/00 (2006.01)
(52) U.S. Cl.
USPC .......................................... 439/487
(58) Field of Classification Search
USPC .......................... 439/73, 487, 331
See application file for complete search history.

(56) References Cited

U.S. PATENT DOCUMENTS

| 7,182,627 | B1 | 2/2007 | Huang |
| 7,729,121 | B1 | 6/2010 | Deshpande et al. |
| 7,988,459 | B2 * | 8/2011 | Ulen et al. ................ 439/73 |
| 8,089,768 | B2 * | 1/2012 | Mauder et al. ............ 361/709 |
| 8,257,110 | B2 * | 9/2012 | Lee et al. ................. 439/487 |
| 2002/0043983 | A1 | 4/2002 | Cheng |
| 2003/0042595 | A1 | 3/2003 | Canella |
| 2003/0168738 | A1 | 9/2003 | Kabadi et al. |
| 2005/0091844 | A1 | 5/2005 | Sathe et al. |
| 2008/0009152 | A1 | 1/2008 | Colbert et al. |
| 2008/0146065 | A1 | 6/2008 | Pandey et al. |
| 2009/0034200 | A1 | 2/2009 | Li et al. |

(Continued)

OTHER PUBLICATIONS

Kandalaft et al, "MEMS device interface board" Abstract, Innovations at ITC 2010, EDA 2012, 4 pp.

(Continued)

Primary Examiner — Phuong Dinh
(74) Attorney, Agent, or Firm — Patrick J. Daugherty; Driggs, Hogg, Daugherty & Del Zoppo Co., LPA

(57) ABSTRACT

A socket has top side pins that may form electrical connections to a central processing unit chip, and a bottom side ball grid array of discrete, electrically-conductive metal surfaces. Differently-keyed setoff apertures are formed through the socket that when disposed about corresponding standoffs projecting upward from a planar circuit board align the socket ball grid array surfaces with grid array pad connections on the circuit board. Retaining screws passing through the socket setoff apertures, when tightened into the planar board standoffs, bring a heatsink downward with compressive force against the socket top side. The socket responsively brings the ball grid array into compressive electrical contact connections with the grid array pad connections on the circuit board, and also compresses against the planar board. The resilient ring may thereby form a seal about the compressively-connected ball grid array and circuit board pads.

20 Claims, 4 Drawing Sheets

(56) References Cited

U.S. PATENT DOCUMENTS

2009/0109628 A1    4/2009   Bezama et al.
2011/0287638 A1   11/2011   Beaman et al.
2012/0092826 A1    4/2012   Heidepriem et al.

OTHER PUBLICATIONS

U.S. Appl. No. 13/449,708, filed Apr. 18, 2012.
Notice of Allowance (Mail Date May 28, 2013) for U.S. Appl. No. 13/449,708, filed Apr. 18, 2012.

* cited by examiner

STRUCTURE FOR REMOVABLE PROCESSOR SOCKET

RELATED APPLICATION

This application is a continuation of U.S. application Ser. No. 13/449,708, filed Apr. 18, 2012 (now U.S. Pat. No. 8,545,258, issued Oct. 1, 2013).

TECHNICAL FIELD OF THE INVENTION

Aspects of the present invention relate to a design structure for mechanically and electrically connecting processor chips to circuit boards.

BACKGROUND

Central processor unit (CPU) chips are generally connected to computer device circuit boards through socket structures that function to mechanically fix the CPU to the board while also providing a circuitry interface that establishes electrical connections to respective elements on the CPU and circuit board. Socket designs for CPU chips generally include a bed of hundreds of pins that the CPU rests upon. The pins, or a separate socket structure including the pins, are soldered to or otherwise permanently affixed to the underlying circuit board in order to provide robust mechanical connections that also provide reliable electronic circuit connections that support the transmission of signals without degrading the information conveyed thereby.

Such connections are generally permanent from the perspective of an end-user. The CPU is generally not removable unless returned to a service provider rework facility. The socket pins are also easily damaged by improper CPU installation, dropped tools, inadvertent handling, and shipping damage. CPU pins are frequently damaged when upgrading a system with additional CPUs, or when swapping CPUs in troubleshooting procedures. Boards shipped to product engineering entities for failure analysis frequently arrive with bent pins, sometimes rendering diagnose of any indicated failure impossible via irrecoverable shipping damage. Bent pins and other damage to the pins may require an entire system board to be replaced. In some implementation examples, as many 20% of CPU-system board assemblies over a designated manufacturing time period must be replaced due to bent CPU pins.

Although improved CPU installation and removal tools may reduce the number and extent of pin damage incidents, such tools do not entirely eliminate the risk and occurrence of pin damage, and damage to expensive components continues to occur.

BRIEF SUMMARY

In one aspect of the present invention, a socket has pins projecting outward from a planar top side of a socket in a grid array to form electrical connections to chip connections on a bottom side of a central processing unit chip. Ball contacts in circuit connection with the top side pins project discrete rounded electrically-conductive metal surfaces outward from a generally planar bottom side of the socket in a ball grid array, the socket bottom side generally parallel to the socket top side, wherein the projecting rounded connection surfaces of the ball grid array are selected to form electrical connections via contact with socket pad connections arrayed in a planar pad grid array on a planar circuit board. Differently keyed setoff apertures formed through the socket between the top and bottom socket sides in a keyed socket aperture arrangement pattern dispose the setoff apertures about corresponding differently keyed standoffs projecting upward from a planar circuit board including the grid array pad connections, so that the socket bottom side ball grid array connection surfaces are aligned with corresponding ones of the grid array pad connections. A ring of compressible resilient material is located on a lower surface of the socket bottom planar side and surrounding the socket ball contacts.

Accordingly, when retaining screws passing through a heat sink disposed above a central processing unit chip above the socket top side, and passing one each through the socket setoff apertures, are tightened into the planar board standoffs, the retaining screws bring the heat sink downward with compressive force against a top surface of the central processor unit chip, which urges the central processor unit chip downward with the compressive force against the socket top side. This results in electrically conductive connections of the chip electrical connections to the socket pins, and the compressive force further received by the socket from the central processing unit chip is translated by the socket to urge the bottom side ball grid array connection surfaces into electrically conductive contact with the aligned circuit board socket pad connections, and to also compress the compressible resilient ring between the socket bottom lower surface and a planar upper surface of the planar circuit board that surrounds the planar pad grid array on the planar circuit board. The compressed ring resists the compression with resilient material forces projected against the socket bottom lower surface and the planar circuit board upper surface and thereby seals the surrounded electrically conductive contacts between the socket bottom side ball grid array connection surfaces and the aligned circuit board socket pad connections from dust and debris infiltration. The retaining screws also thereby mechanically maintain the electrically conductive contacts between the socket bottom side ball grid array connection surfaces and the aligned circuit board socket pad connections in a fixed assembly without requiring permanently affixing said connections together via solder or an adhesive.

In another aspect, a method interposes a central processing unit chip above a socket between a top heat sink and a bottom planar upper surface of a circuit board. The central processing unit chip is electrically connected on a bottom side to pins projecting outward from a planar top side of the socket, and the socket pins are in circuit communication with ball contacts projecting discrete rounded electrically-conductive metal surfaces outward from a generally planar bottom side of the socket in a ball grid array, the socket bottom side generally parallel to the socket top side. The method further includes disposing threaded retaining screws through the heat sink and through each of differently keyed setoff apertures formed through the socket between the top and bottom socket sides in a keyed socket aperture arrangement pattern into corresponding differently keyed threaded standoffs projecting upward from the planar circuit board.

Rotating the threaded retaining screws into the threaded standoffs in the method tightens the heat sink downward with compressive force against a top surface of the central processor unit chip, which urges the central processor unit chip downward with the compressive force against the socket. The socket translates the compressive force from the central processing unit chip to urge the bottom side ball grid array connection surfaces into electrically conductive contact with the aligned circuit board socket pad connections on the planar circuit board upper surface, and to compress a ring of compressible resilient material between a lower surface of the socket bottom planar side that surrounds the socket ball contacts and a planar upper surface of the planar circuit board that surrounds the planar pad grid array on the planar circuit board. The compressed ring projects resilient material forces against the socket bottom lower surface and the planar circuit board upper surface in resistance to the compressive force translated by the socket, thereby sealing the surrounded electrically conductive contacts between the socket bottom side ball grid array connection surfaces and the aligned circuit board socket pad connections from dust and debris infiltration.

In another aspect, an article of manufacture includes a hardware description language (HDL) design structure encoded on machine-readable data storage medium that when processed in a computer-aided design system generates a machine-executable representation of a socket. Said socket has pins projecting outward from a planar top side of a socket in a grid array to form electrical connections to chip connections on a bottom side of a central processing unit chip. Ball contacts in circuit connection with the top side pins project discrete rounded electrically-conductive metal surfaces outward from a generally planar bottom side of the socket in a ball grid array, the socket bottom side generally parallel to the socket top side, wherein the projecting rounded connection surfaces of the ball grid array are selected to form electrical connections via contact with socket pad connections arrayed in a planar pad grid array on a planar circuit board. Differently keyed setoff apertures formed through the socket between the top and bottom socket sides in a keyed socket aperture arrangement pattern dispose the setoff apertures about corresponding differently keyed standoffs projecting upward from a planar circuit board including the grid array pad connections, so that the socket bottom side ball grid array connection surfaces are aligned with corresponding ones of the grid array pad connections. A ring of compressible resilient material is located on a lower surface of the socket bottom planar side and surrounding the socket ball contacts.

Accordingly, when retaining screws passing through a heat sink disposed above a central processing unit chip above the socket top side, and passing one each through the socket setoff apertures, are tightened into the planar board standoffs, the retaining screws bring the heat sink downward with compressive force against a top surface of the central processor unit chip, which urges the central processor unit chip downward with the compressive force against the socket top side. This results in electrically conductive connections of the chip electrical connections to the socket pins, and the compressive force further received by the socket from the central processing unit chip is translated by the socket to urge the bottom side ball grid array connection surfaces into electrically conductive contact with the aligned circuit board socket pad connections, and to also compress the compressible resilient ring between the socket bottom lower surface and a planar upper surface of the planar circuit board that surrounds the planar pad grid array on the planar circuit board. The compressed ring resists the compression with resilient material forces projected against the socket bottom lower surface and the planar circuit board upper surface and thereby seals the surrounded electrically conductive contacts between the socket bottom side ball grid array connection surfaces and the aligned circuit board socket pad connections from dust and debris infiltration. The retaining screws also thereby mechanically maintain the electrically conductive contacts between the socket bottom side ball grid array connection surfaces and the aligned circuit board socket pad connections in a fixed assembly without requiring permanently affixing said connections together via solder or an adhesive.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings in which.

Figure 1:
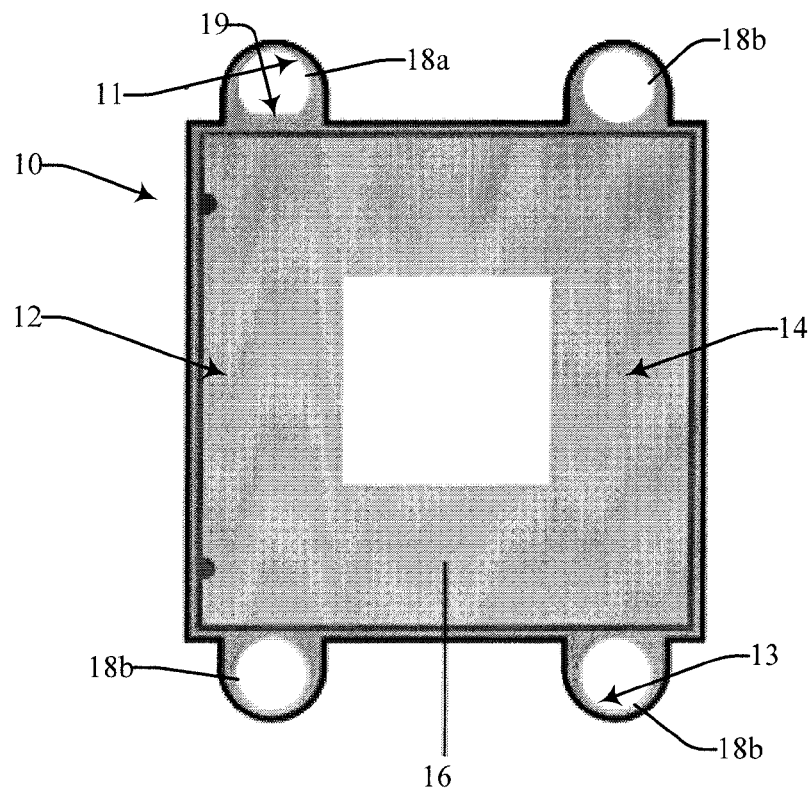
FIG. 1 is a diagrammatic illustration of a top view of a socket according to the present invention.

The drawings are not necessarily to scale. The drawings are merely schematic representations, not intended to portray specific parameters of the invention. The drawings are intended to depict only typical aspects of the invention, and therefore should not be considered as limiting the scope of the invention. In the drawings, like numbering represents like elements.

DETAILED DESCRIPTION

FIGS. 1 through 4 illustrate an aspect of a disposable, field-replaceable CPU socket 10 according to the present invention, which provides a connection between a CPU 32 and a computer system planar circuit board 34. FIG. 1 provides a top view of the socket 10, wherein the top side 12 includes a plurality of pins 14 in a grid array 16 configured to interface with conventional chip connections on the CPU chip 32. The pin grid array 16 may be selected to support one or more CPU chips 32. The pin grid array 16 illustrated in FIG. 1 is selected to connect to a CPU with chip connection arrays that comply with Intel® Xeon® Nehalem processors. (INTEL and XEON are trademarks of the Intel Corporation in the United States or other countries.) Other socket aspects according to the present invention may have a pin grid array 16 selected to connect to a CPU with chip connection arrays that comply with "Sandy Bridge-E (enthusiast)" roadmap or platform standard utilized by chips manufactured by the Intel Corporation, and still other pin grid arrays 16 will be apparent to one skilled in the art.

Figure 2:
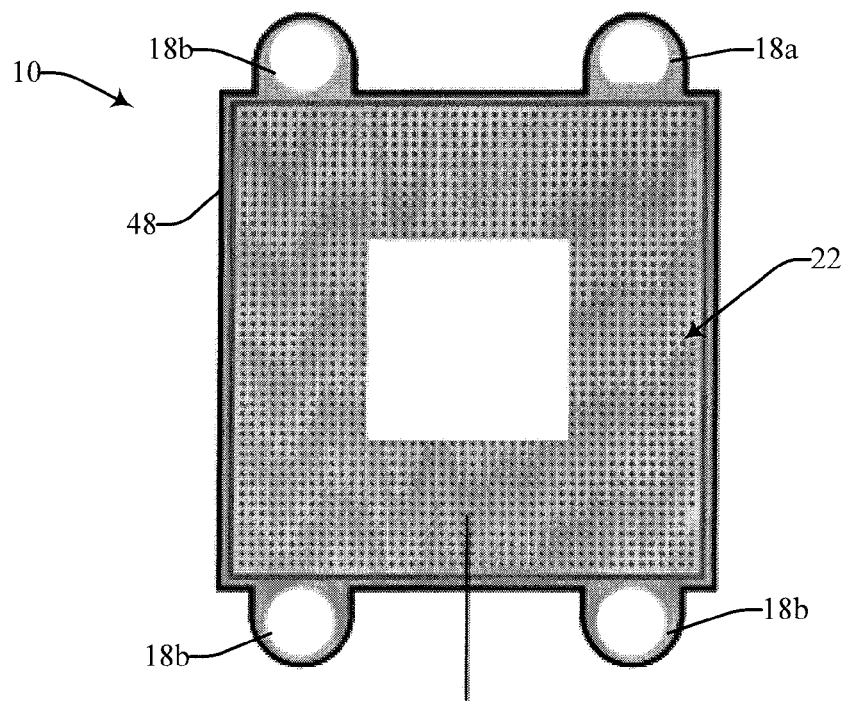
FIG. 2 is a diagrammatic illustration of a bottom view of the socket of FIG. 1.
Figure 3:
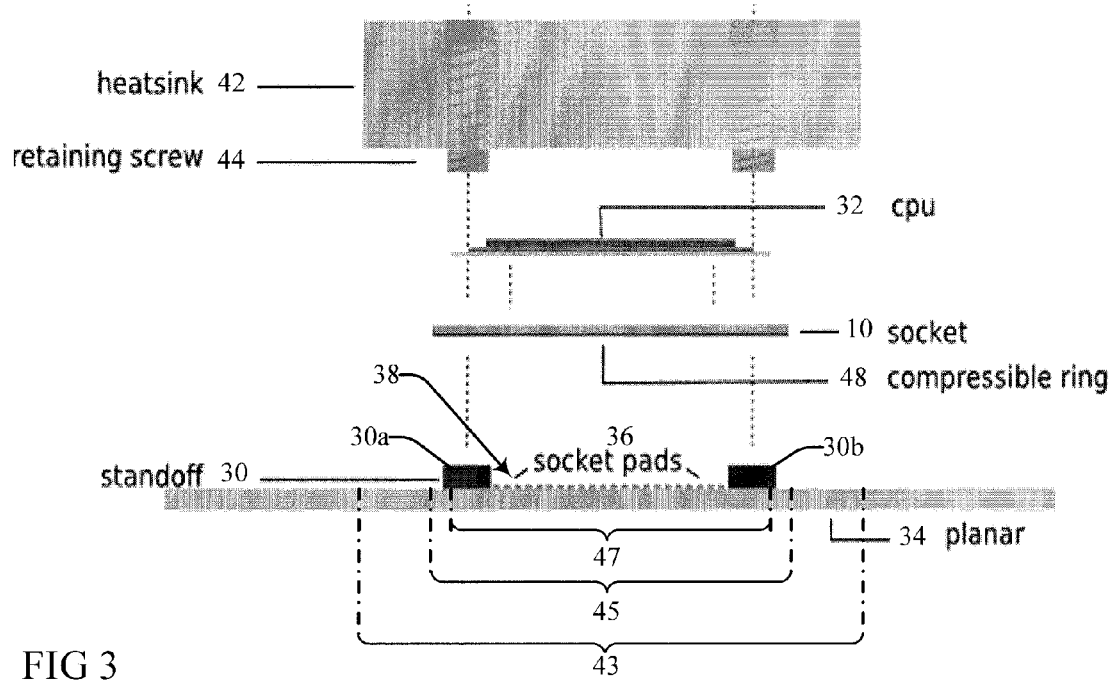
FIG. 3 is a diagrammatic illustration of a side perspective exploded view of an assembly using the socket of FIGS. 1 and 2 according to the present invention.
Figure 4:
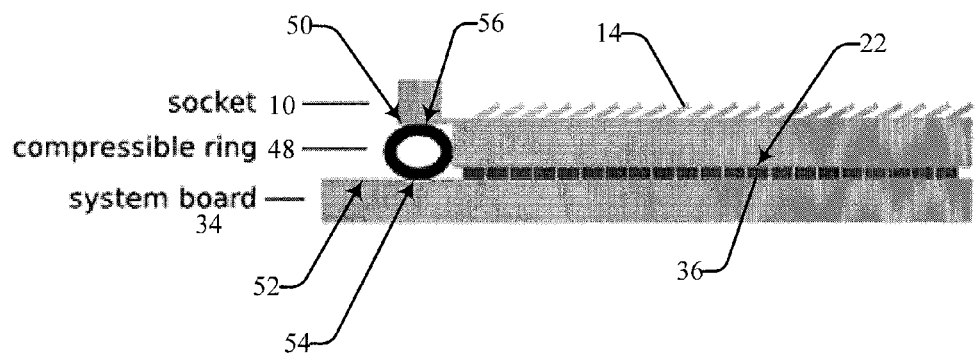
FIG. 4 is a diagrammatic illustration of a portion of an assembly of components depicted in FIG. 3.

FIG. 2 provides a bottom view of the socket 10, which includes a ball grid array (BGA) 20 of a plurality of ball contacts 22 that each project discrete spherical or rounded connection surfaces outward from the socket 10. FIG. 3 is a side perspective exploded view of an assembly using the socket 10 to connect a CPU 32 to a planar circuit board 34 that includes a plurality of socket pad connections 36 in a grid array 38 corresponding to the socket 10 BGA 20.

In the prior art, solder ball BGA's are commonly used to attach components to circuit board pads or other connectors in manufacturing processes by the heating the solder BGA's to their melting points (sometimes referred to as wetting the solder) while in contact with or adjacent to said circuit board connector, thereby fusing the melting BGA's to their respective component connection structures on the circuit upon cooling and re-solidifying the solder. Other prior art processes may use an additional solder or other adhesive component to permanently affix the BGA's to the circuit board connections. In contrast, the present socket 10 BGA's contacts 22 are not provided to be subjected to a melting process or other solder or adhesive process that mechanically connects them to the circuit board connection, but wherein the individual contacts 22 are not mechanically attached or affixed to the planar pads 36 when the socket 10 is in place. They are instead configured to form electrical conductive path connections to the pads 36 when brought into physical contact with said pads 36, and to maintain said contact through socket 10 structures that keep the BGA 20 in a constant fixed position relative to the planar pad array 38 when the socket 10 is installed on the planar board 34.

In the present example, the socket 10 has four apertures including at least two differently keyed shapes 18a and cylindrical shapes 18b that are selected and designed to securely fit over corresponding keyed standoffs 30a or cylindrical standoffs 30b on the system board. The BGA 20 is located on the socket 10 in alignment with the apertures 18a and 18b so that when the apertures 18a and 18b are placed onto and about corresponding ones of the standoffs 30a or 30b the BGA 20 contacts 22 are each aligned with corresponding ones of the planar socket pads 36. This alignment contemplates that the pad array 38 is similarly located on the planar board 34 in alignment with the standoffs 30a or 30b, and thereby with the apertures 18a and 18b when in position about the standoffs 30a or 30b.

The arrangement of the apertures 18a/18b and standoffs 30a/30b are selected so that the socket 10 may only have one installation alignment of the BGA 20 relative to the planar pad grid array 38. In the present example, the four apertures 18 include one keyed aperture 18a that has an inner planar sidewall 19 portion projecting into a remainder cylindrical sidewall portion 11, and three other apertures 18b which each have a continuous cylindrical interior sidewall 13. The four standoffs 30 provided on the planar include one keyed standoff 30a that has an outer surface corresponding to the first aperture 18a (a flattened planar sidewall aligned inward to correspond to the aperture 18a inner planar sidewall 19 portion, and a remainder outer cylindrical surface conforming to the aperture 18a remainder cylindrical sidewall portion 11), and three cylindrical standoffs 30b that have outer cylindrical surfaces that align with and fit within the cylindrical interior sidewalls 13 of any of the three other apertures 18b. As the single keyed aperture 18a will only fit over the single, corresponding keyed standoff 30a, the arrangement ensures that the socket may only be installed in one alignment with respect to the standoffs 30; it cannot be rotated into an alternative position with the aperture 18a over any of the other cylindrical standoffs 30b, as the key shape of the aperture 18a will not fit over said cylindrical standoffs 30b. This ensures that the socket 10 cannot be inadvertently rotated when installed which would result in rotation of the BGA 20 out of alignment with the planar pad grid array 38 by 90, 180, or 270 degrees. Further, as the top side of the socket 10 has the pin grid array 16 and the bottom side has the BGA 20, these features readily distinguish the top and bottom sides from each other, both visually and functionally: the socket 10 cannot be installed upside down, further ensuring proper alignment of the BGA 20 and the planar pads grid array 38 at installation.

Tolerances of differences between inner wall radial dimensions of the apertures 18a/18b and the radial outer surface dimensions of standoffs 30a/30b are selected to cause the aperture 18a inner wall surfaces to tightly fit about and engage the outer surfaces of the standoff 30a, and the apertures 18b inner wall surface to tightly fit about and engage the outer surface of the standoffs 30b. These engagements thereby guide the socket 10 into its position onto the planar circuit board 34, and also thereby each of the BGA contacts 22 into electrical contact with mating pads 36 in the planar grid array 38. The differences or tolerances between the inner and outer surface dimensions are selected so that the apertures 18a/18b engage the respective standoffs 30a/30b to keep the BGA contacts 22 from shifting sideways out of contact with their corresponding mating planar grid array pads 36. Thus, in one aspect, the difference or tolerance between the inner radii or width dimensions of the inner surfaces of the engaging apertures 18a/18b, and the outer radii or width dimensions of the outer surfaces of their respective mating standoffs 30a/30b is not greater than a width or length dimension of any of the pads 38 brought into contact with any one of the socket contacts 22 (otherwise shifting of the socket 10 sideways could cause the socket contact 22 to move out of physical contact with a mating planar pad 36).

The standoffs 30a and 30b also function as mounting posts for attaching the CPU 32 to the socket 10, and the socket 10 to the planar 34 in a sandwich design via retaining screws 44 that tighten a heat sink 42 onto the planar board 38, and thereby against the interposed CPU 32 and socket 10 assembly. More particularly, tightening the retaining screws 44 causes the heat sink 42 to be compelled downward with force against the upper CPU 32 surface, which urges the CPU 32 downward against the socket 10, compressing the electrical connections of the CPU 32 against the top side socket pins 14. This downward force is thereby received by the rigid socket 10 body, which translates the downward force to the BGA 20 ball contacts 22, and thereby compels the contacts 22 with force against the planar pads 36. The downward forces imparted upon the heat sink 42 via the retaining screws 44 thereby mechanically form physical contact circuit connections between the electrically conductive CPU 32 electrical connections and the engaged top side socket pins 14, and between the BGA 20 ball contacts 22 and their respective mating planar pads 36, while also holding the assembly in place.

In this fashion, the respective electrical connections are maintained without the need to permanently affix the connections together via solder or other permanent adhesives as taught by the prior art. Instead, the compression forces caused by tightening the heat sink 42 downward toward the planar board 34 via the retaining screws 44, and the tight tolerances between the apertures 18a/18b and their respective engaging standoffs 30a/30b, cause the socket BGA contacts 22 to form a physical electrical connection with their corresponding mating planar grid array pads 36, cause the CPU 32 electrical connections to form a physical electrical connection with their corresponding and engaged top side socket pins 14, and further maintain the integrity of these electrical connections without the need for solder or adhesive attachment.

Thus, the CPU 32 and socket 10 are held in place by the heat sink 42 as opposed to being secured independently. Prior art designs generally require a large CPU retention bracket surrounding prior art sockets on all sides, resulting in a loss of valuable surface real estate, in some example several square inches (depending on the specific CPU and socket model type). In contrast, by using the present socket 10, this valuable space may now be used for other components.

Hinged or bracketed testing structures are known in the prior art for temporarily electrically connecting CPU's to planar board contacts without solder or other adhesive means. However, in order to achieve electrical connections of sufficient electrical integrity without solder or similar robust adhesives, the hinged or bracketed structures of the prior art require relative large and robust hinges and latching springs and brackets to surround the entire assembly, and which must be incorporated onto the planar board and consume available surface area on the planar board. In contrast, the present aspect leverages existing heat sink designs for compression while using the heat sink retaining screws and keyed or otherwise aligned standoff engagement structure posts in one continuous retaining screw/standoff assembly for alignment, and for supplying the mounting tensions needed for the whole assembly simply by tightening the heat sink on top, rather than compressing a spring using a latching mechanism. The aspect also eliminates the additional latching and compression mechanisms of the prior art which frequently cause damage through improper installation.

Sockets 10 of the present aspect may be practiced entirely within the footprint 43 of the heat sink upon the planar board 34; surface space on the planar board 34 consumed by the footprint 45 of the socket 10 itself may be smaller than the heat sink footprint 43. The socket 10 footprint does not extend significantly beyond a footprint 47 of the CPU 32 itself, saving valuable planar board real estate as well as enabling removable installations of CPU in tight footprints too small for conventional hinge or bracket mounts.

The present socket 10 also incorporates a ring 48 of rubber or other compressible material which surrounds the bottom of the socket 10 and prevents dust and debris from slipping between the system board 34 and the socket 10 when installed and tightened into position. FIG. 4 provides a view taken along a portion of a section of an assembly of the socket 10 and the planar board 38 as described above (the CPU 32 is omitted from FIG. 4 in order to provide a simpler, clearer view of the assembly portion depicted therein). With the socket 10 tightened into final installation on the circuit board 38 via the heat sink 42 and retaining screws 44 described above, a hollow circular tube ring 48 formed of resilient rubber and having elastic and shape memory properties is compressed between a lower surface 50 of an outer edge wall of the socket 10 and an upper surface area 52 of the planar board 38 that encompasses the grid array 38 of planar pads 36 and the standoffs 30*a* and 30*b*. The compression causes the ring 48 to deform into the oblong cross-sectional shape depicted in FIG. 4. The resilient ring 48 material resists this deformation, pushing back with force to try to return to its original round shape (or to at least return to a higher original height than the compressed height depicted).

Using rubber or other resilient and deformable material for the ring thus enables the deforming ring to form sealing interfaces 54 and 56 with the planar board upper surface 52 and the socket edge wall lower surface 50, respectively, keeping dust and other debris from entering into the enclosure formed by the encompassing ring 48. In one aspect, the ring 48 thus helps to prevent dust and debris from entering the assembly at the interface between the socket 10 and the planar board 34 interposing themselves between respective mating contacting surfaces of BGA contacts 22 and the planar pads 36, which might break or otherwise interfere with the electrical circuit connections formed by said contact interfaces. The sealing ring 48 thereby helps to maintain the integrity of the electrical connection without the need for solder or other permanent adhesives.

Thus, the socket 10 acts as an electrical interface or interconnect between the system board 34 and the CPU 32 and may be replaced independently of the planar 34 or the CPU 32. This provides a cost savings over conventional socket structures in remedying bent or damaged CPU mounting pins: the socket 10 itself may be simply and quickly replaced, which is less costly in expense and time compared to repairing or replacing the system board 34 itself, as is typically required in the prior art in the case of damaged pins. Replacing the socket 10 instead also retains the otherwise acceptable and functioning condition of the underlying system integrating the circuit board 34.

In contrast to the prior art, the socket 10 can be exchanged without special tools: one need merely to unscrew and remove the heat sink 42. The socket 10 is not specific to any individual processor package, but may be adapted to fit any CPU. It will also be understood that that the present socket 10 uses pins 14 on the top and a ball grid array 20 on the bottom; other socket aspects according to the present invention may use different connectors at the top or bottom, for example pins on both the top and bottom of the socket.

The sockets 10, integrated planar circuit boards 34 and central processing chips 32 can be distributed by a fabricator in raw wafer form (for example, as a single wafer that has multiple unpackaged chips), as a bare die, or in a packaged form. In the latter case, the chip 32 is mounted in a single chip package (such as a plastic carrier, with leads that are affixed to the socket 10, which is electronically connected to a motherboard or other higher level carrier 34) or in a multichip package (such as a ceramic carrier 34 that has buried interconnections). In any case, the chip 32 is then integrated with other chips, discrete circuit elements, and/or other signal processing devices as part of either (a) an intermediate product, such as a motherboard 34, or (b) an end product. The end product can be any product that includes integrated circuit chips, ranging from toys and other low-end applications to advanced computer products having a display, a keyboard or other input device, and a central processor 32.

Figure 5:
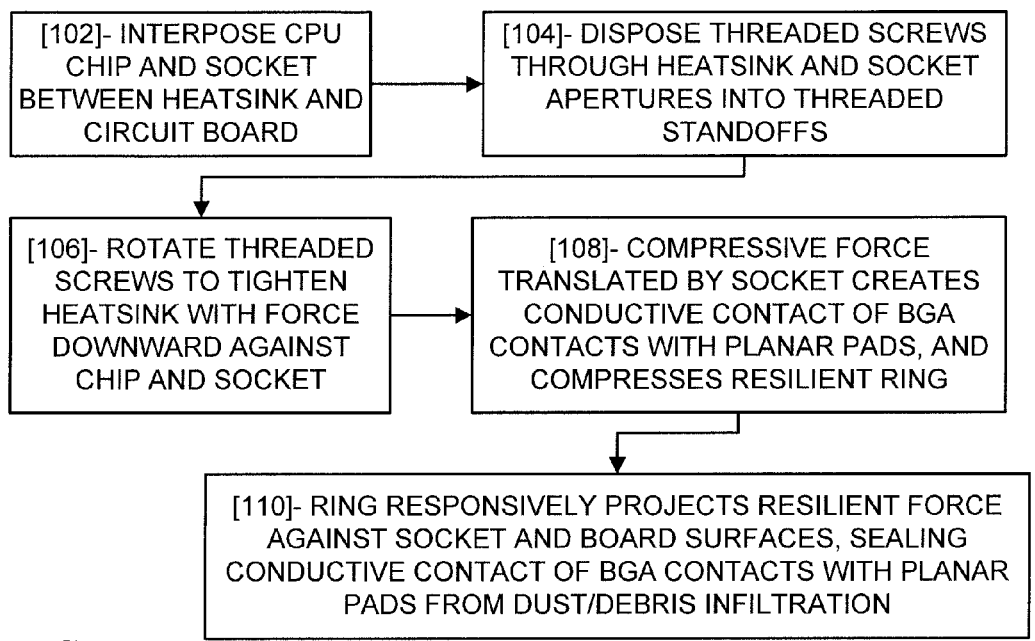
FIG. 5 is block diagram illustration of a method for assembling a chip to a circuit board utilizing a socket according to the present invention.

FIG. 5 illustrates a method according to the present invention wherein at 102 a central processing unit chip electrically connected on a bottom side to a plurality of pins projecting outward from a planar top side of a socket (for example, the socket 10 of FIGS. 1-4 and described above) is interposed between a top heat sink and a bottom planar upper surface of a circuit board. The socket pins are in circuit communication with plurality of ball contacts projecting discrete rounded electrically-conductive metal surfaces outward from a generally planar bottom side of the socket in a ball grid array, wherein the socket bottom side is generally parallel to the socket top side.

At 104 threaded retaining screws are disposed through the heat sink and through each of a plurality of differently keyed setoff apertures formed through the socket between the top and bottom socket sides in a keyed socket aperture arrangement pattern into corresponding differently keyed threaded standoffs projecting upward from the planar circuit board.

At 106 the threaded retaining screws are rotated into the threaded standoffs to tighten the heat sink downward with compressive force against a top surface of the central processor unit chip, which urges the central processor unit chip downward with the compressive force against the socket. At 108 the compressive force received from the central processing unit chip is translated by the socket into a downward force that urges the bottom side ball grid array connection surfaces into electrically conductive contact with the aligned circuit board socket pad connections on the planar circuit board upper surface, and further compresses a ring of compressible resilient material between a lower surface of the socket bottom planar side that surrounds the plurality of socket ball contacts and a planar upper surface of the planar circuit board that surrounds the planar pad grid array on the planar circuit board.

At 110 the compressed ring projects resilient material forces against the socket bottom lower surface and the planar circuit board upper surface in resistance to the compressive force translated by the socket, thereby sealing the surrounded electrically conductive contacts between the socket bottom side ball grid array connection surfaces and the aligned circuit board socket pad connections from dust and debris infiltration. More particularly, the compressive force generated by the tightened retaining screws mechanically maintain the electrically conductive contacts between the socket bottom side ball grid array connection surfaces and the aligned circuit board socket pad connections in a fixed assembly without requiring permanently affixing said connections together via solder or an adhesive.

The method as described above is used in the fabrication of integrated circuit chips. Lower manufacturing costs may also be reduced by using aspects according to the present invention. In the prior art, CPU sockets are generally installed on the planar board in a factory process, to wet the solder connections required in the prior art. In contrast, there is no need to install multiple sockets 10 until multiple CPUs are actually installed in a subsequent assembly process, thereby reducing socket material costs and processes otherwise required at the time of manufacture.

Figure 6:
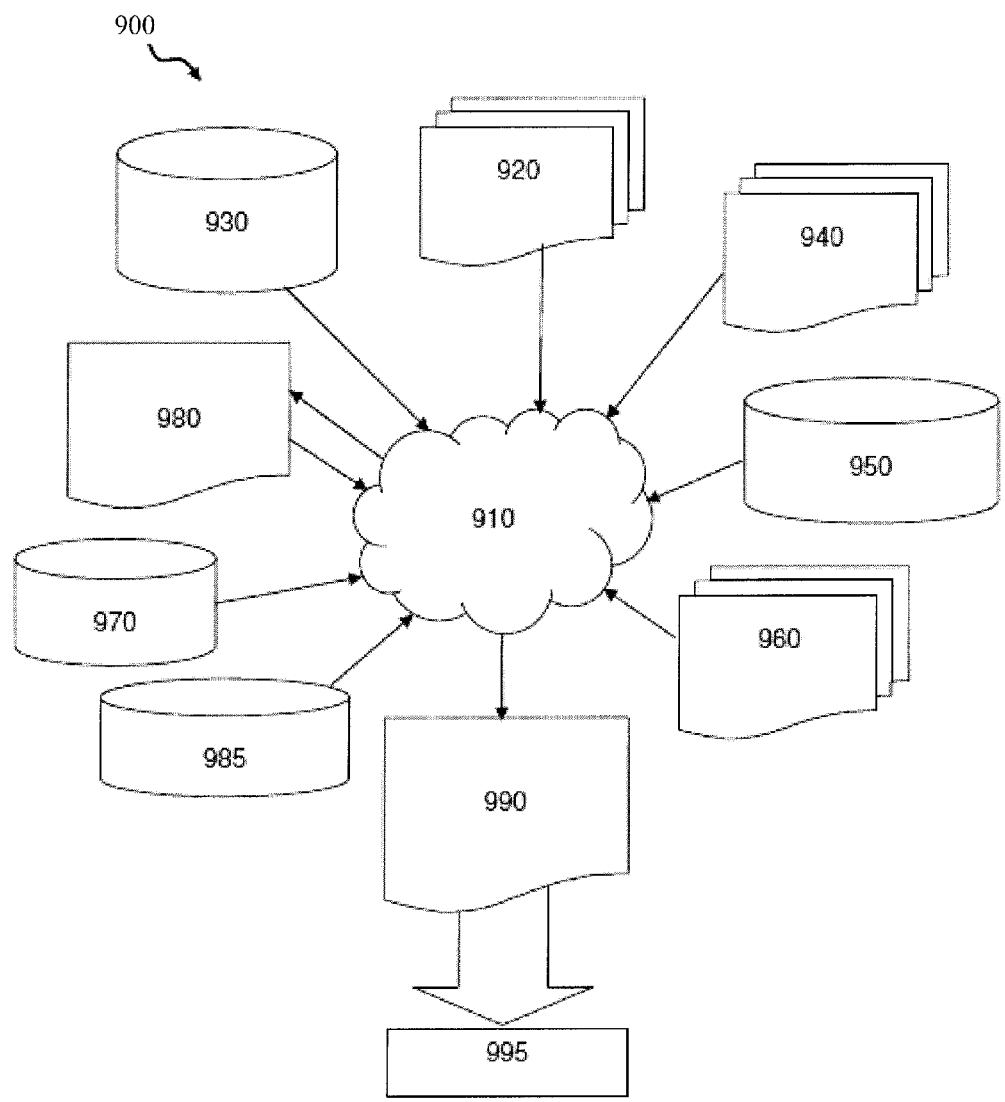
FIG. 6 is a flow diagram of a design process used in semiconductor design, manufacture, and/or test.

FIG. 6 is an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4 as discussed above. The design structures processed and/or generated by design flow 900 may be encoded on machine-readable transmission or storage media to include data and/or instructions that, when executed or otherwise processed on a data processing system, generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively include data and/or program instructions that when processed by design process 910, generate a functional representation of the physical structure of a hardware device. Whether representing functional and/or structural design features, design structure 920 may be generated using an electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4. As such, design structure 920 may include files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4 to generate a Netlist 980 which may contain design structures such as design structure 920. Netlist 980 may include, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably includes one or more files, data structures, or other computer-encoded data or instructions that reside on transmission or data storage media and that, when processed by an ECAD system, generate a logically or otherwise functionally equivalent form of one or more of the aspects of the invention shown in FIGS. 1-4. In one aspect, design structure 990 may include a compiled, executable HDL simulation model that functionally simulates the devices shown in FIGS. 1-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may include information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 990 may then proceed to a stage 995 where, for example, design structure 990 proceeds to tape-out, is released to manufacturing, is released to a mask house, is sent to another design house, is sent back to the customer, etc.

The terminology used herein is for describing particular aspects only and is not intended to be limiting of the invention. As used herein, the singular forms "a", "an" and "the" are intended to include the plural forms as well, unless the context clearly indicates otherwise. It will be further understood that the terms "includes" and/or "including" when used in this specification, specify the presence of stated features, integers, steps, operations, elements, and/or components, but do not preclude the presence or addition of one or more other features, integers, steps, operations, elements, components, and/or groups thereof. Certain examples and elements described in the present specification, including in the claims and as illustrated in the Figures, may be distinguished or otherwise identified from others by unique adjectives (e.g. a "first" element distinguished from another "second" or "third" of a plurality of elements, a "primary" distinguished from a "secondary" one or "another" item, etc.) Such identifying adjectives are generally used to reduce confusion or uncertainty, and are not to be construed to limit the claims to any specific illustrated element or aspect, or to imply any precedence, ordering or ranking of any claim elements, limitations or process steps.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The aspect was chosen and described in order to best explain the principles of the invention and the practical application, and to enable others of ordinary skill in the art to understand the invention for various aspects with various modifications as are suited to the particular use contemplated.

What is claimed is:

1. A socket, comprising:

a plurality of pins projecting outward from a planar top side of a socket in a grid array to form electrical connections to a plurality of chip connections on a bottom side of a central processing unit chip;

a plurality of ball contacts in circuit connection with the top side pins and projecting discrete rounded electrically-conductive metal surfaces outward from a generally planar bottom side of the socket in a ball grid array, the socket bottom side generally parallel to the socket top side, wherein the projecting rounded connection surfaces and the ball grid array are selected to form electrical connections via contact with each of a plurality of socket pad connections arrayed in a planar pad grid array on a planar circuit board;

a plurality of differently keyed setoff apertures formed through the socket between the top and bottom socket sides in a keyed socket aperture arrangement pattern selected to dispose the plurality of differently keyed setoff apertures about corresponding differently keyed standoffs projecting upward from a planar circuit board comprising the grid array pad connections so that the socket bottom side ball grid array connection surfaces are aligned with corresponding ones of the grid array pad connections; and a ring of compressible resilient material located on a lower surface of the socket bottom planar side and surrounding the plurality of socket ball contacts;

wherein when retaining screws passing through a heatsink disposed above a central processing unit chip above the socket top side, and passing one each through the socket setoff apertures, are threaded one each into the planar board standoffs and tightened, the retaining screws bring the heatsink downward with compressive force against a top surface of the central processor unit chip which urges the central processor unit chip downward with the compressive force against the socket top side and results in electrically conductive connections of the chip electrical connections to the socket pins, the compressive force further received by the socket from the central processing unit chip and translated by the socket to urge the bottom side ball grid array connection surfaces into electrically conductive contact with the aligned circuit board socket pad connections and to compress the compressible resilient ring between the socket bottom lower surface and a planar upper surface of the planar circuit board that surrounds the planar pad grid array on the planar circuit board;

wherein the compressed ring resists the compression with resilient material forces projected against the socket bottom lower surface and the planar circuit board upper surface and thereby seals the surrounded electrically conductive contacts between the socket bottom side ball grid array connection surfaces and the aligned circuit board socket pad connections from dust and debris infiltration; and wherein the retaining screws thereby mechanically maintain the electrically conductive contacts between the socket bottom side ball grid array connection surfaces and the aligned circuit board socket pad connections in a fixed assembly without requiring permanently affixing said connections together via solder or an adhesive.

2. The socket of claim 1, wherein the compressible resilient material ring is a hollow circular tube ring formed of resilient rubber and having elastic and shape memory properties.

3. The socket of claim 2, wherein the plurality of differently keyed setoff apertures comprises a keyed aperture comprising a keyed interior sidewall surface aligned generally normal to the top and bottom socket sides, and a non-keyed aperture comprising a non-keyed aperture interior sidewall surface aligned generally normal to the top and bottom socket sides that is different from the keyed interior sidewall surface; and
wherein the keyed socket aperture arrangement pattern corresponds to an arrangement pattern of a plurality of standoffs on the planar circuit board so that the keyed aperture aligns with and its keyed aperture interior sidewall surface disposes about a keyed standoff of the plurality of standoffs, and the non-keyed aperture aligns with and its non-keyed aperture interior sidewall surface disposes about a non-keyed standoff of the plurality of standoffs; and
wherein the interior sidewall surface of the keyed aperture will not fit around the non-keyed standoff exterior sidewall surface and prevents the keyed aperture from being disposed about the non-keyed standoff; and
wherein the keyed socket aperture arrangement pattern corresponds to the standoff arrangement pattern only in a single installation position of the bottom side of the socket upon the planar board, wherein rotation of the socket along an axial direction generally normal to the planar top and bottom socket sides to align each of the socket apertures with different ones of the standoffs will cause one of keyed apertures to align with one of the non-keyed standoffs, thereby preventing the one socket keyed aperture to be disposed on the non-keyed standoff.

4. The socket of claim 3, wherein the keyed aperture interior sidewall surfaces disposed about the keyed standoff mate with corresponding surfaces of the keyed standoff within a tolerance difference in respective radial dimensions, and the non-keyed aperture interior sidewall surface disposed about the non-keyed standoff mates with a corresponding surface of the non-keyed standoff within the tolerance difference in respective radial dimensions;
wherein the tolerance difference is smaller than a width or a length dimension of any of the aligned circuit board socket pad connections brought into the electrically conductive contacts with the socket bottom side ball grid array connection surfaces.

5. The socket of claim 4, wherein the socket is disposed entirely within a footprint of the heatsink on the planar circuit board.

6. The socket of claim 4, wherein a footprint of the socket on the planar circuit board is smaller than and disposed entirely within the footprint of the heatsink.

7. The socket of claim 6, wherein the retaining screws thereby cause the heatsink to hold the central processing unit and the socket in place in a fixed assembly without requiring an additional retention bracket to surround the sockets and attach the socket to the planar board through consuming surface area on the circuit board that surrounds the ring compressed against the upper surface of the circuit board.

8. A method, comprising:
interposing a central processing unit chip above a socket between a top heatsink and a bottom planar upper surface of a circuit board, wherein the central processing unit chip is electrically connected on a bottom side to a plurality of pins projecting outward from a planar top side of the socket, and wherein the socket pins are in circuit communication with a plurality of ball contacts projecting discrete rounded electrically-conductive metal surfaces outward from a generally planar bottom side of the socket in a ball grid array, wherein the socket bottom side is generally parallel to the socket top side;
disposing threaded retaining screws through the heatsink and through each of a plurality of differently keyed setoff apertures formed through the socket between the top and bottom socket sides in a keyed socket aperture arrangement pattern into corresponding differently keyed threaded standoffs projecting upward from the planar circuit board; and
rotating the threaded retaining screws into the threaded standoffs to tighten the heatsink downward with compressive force against a top surface of the central processor unit chip, which urges the central processor unit chip downward with the compressive force against the socket;
the socket translating the compressive force from the central processing unit chip to urge the bottom side ball grid array connection surfaces into electrically conductive contact with the aligned circuit board socket pad connections on the planar circuit board upper surface, and to compress a ring of compressible resilient material between a lower surface of the socket bottom planar side that surrounds the plurality of socket ball contacts and a planar upper surface of the planar circuit board that surrounds the planar pad grid array on the planar circuit board;
the compressed ring projecting resilient material forces against the socket bottom lower surface and the planar circuit board upper surface in resistance to the compressive force translated by the socket, thereby sealing the surrounded electrically conductive contacts between the socket bottom side ball grid array connection surfaces and the aligned circuit board socket pad connections from dust and debris infiltration.

9. The method of claim 8, further comprising:
the compressive force generated by the tightened retaining screws mechanically maintaining the electrically conductive contacts between the socket bottom side ball grid array connection surfaces and the aligned circuit board socket pad connections in a fixed assembly without requiring permanently affixing said connections together via solder or an adhesive.

10. The method of claim 9, further comprising:
holding the central processing unit and the socket in place in a fixed assembly in response to the compressive force imparted by the tightening the retaining screws and without requiring an additional retention bracket to surround the socket and attach the socket to the planar board.

11. The method of claim 10, wherein the compressible resilient material ring is a hollow circular tube ring formed of resilient rubber and having elastic and shape memory properties, and wherein the method further comprises:
the ring deforming into an oblong cross-sectional shape in response to the compressive force translated by the socket; and
the ring oblong cross-sectional shape pushing back against the socket bottom lower surface and the planar circuit board upper surface with force to try to return to its original round shape, thereby sealing the surrounded electrically conductive contacts between the socket bottom side ball grid array connection surfaces and the aligned circuit board socket pad connections from dust and debris infiltration.

12. The method of claim 11, wherein the plurality of differently keyed setoff apertures comprises a keyed aperture comprising a keyed interior sidewall surface aligned generally normal to the top and bottom socket sides, and a non-keyed aperture comprising a non-keyed aperture interior sidewall surface aligned generally normal to the top and bottom socket sides that is different from the keyed interior sidewall surface, wherein the keyed socket aperture arrangement pattern corresponds to an arrangement pattern of a plurality of standoffs on the planar circuit board; and the method further comprising:
the keyed aperture aligning with and its keyed aperture interior sidewall surface disposing about and engaging an exterior surface of a keyed standoff of the plurality of standoffs;
the non-keyed aperture aligning with and its non-keyed aperture interior sidewall surface disposing about and engaging an exterior surface of a non-keyed standoff of the plurality of standoffs; and
the engaging of the keyed standoff and non-keyed standoff aligning the socket bottom side ball grid array connection surfaces into the electrically conductive contacts with the aligned circuit board socket pad connections on the planar circuit board upper surface.

13. The method of claim 12, wherein the interior sidewall surface of the keyed aperture will not fit around the non-keyed standoff exterior sidewall surface and prevents the keyed aperture from being disposed about the non-keyed standoff; and
wherein the keyed socket aperture arrangement pattern corresponds to the standoff arrangement pattern only in a single installation position of the bottom side of the socket upon the planar board, wherein rotation of the socket along an axial direction generally normal to the planar top and bottom socket sides to align each of the socket apertures with different ones of the standoffs will cause one of the keyed apertures to align with one of the non-keyed standoffs, thereby preventing the one socket keyed aperture to be disposed on the non-keyed standoff.

14. The method of claim 13, further comprising:
the keyed aperture interior sidewall surfaces disposed about the keyed standoff mating with corresponding surfaces of the keyed standoff within a tolerance difference in respective radial dimensions; and
the non-keyed aperture interior sidewall surface disposed about the non-keyed standoff mating with a corresponding surface of the non-keyed standoff within the tolerance difference in respective radial dimensions;
wherein the tolerance difference is smaller than a width or a length dimension of any of the aligned circuit board socket pad connections brought into the electrically conductive contacts with the socket bottom side ball grid array connection surfaces.

15. The method of claim 14, further comprising:
disposing the socket on the planar circuit board entirely within a footprint of the heatsink on the planar circuit board.

16. The method of claim 15, wherein a footprint of the socket on the planar circuit board is smaller than and disposed entirely within the footprint of the heatsink.

17. An article of manufacture, comprising:
a hardware description language (HDL) design structure encoded on a machine-readable data storage medium, said HDL design structure comprising elements that when processed in a computer-aided design system generates a machine-executable representation of a socket, wherein said socket comprises:
a plurality of pins projecting outward from a planar top side of a socket in a grid array to form electrical connections to a plurality of chip connections on a bottom side of a central processing unit chip;
a plurality of ball contacts in circuit connection with the top side pins and projecting discrete rounded electrically-conductive metal surfaces outward from a generally planar bottom side of the socket in a ball grid array, the socket bottom side generally parallel to the socket top side, wherein the projecting rounded connection surfaces and the ball grid array are selected to form electrical connections via contact with each of a plurality of socket pad connections arrayed in a planar pad grid array on a planar circuit board;
a plurality of differently keyed setoff apertures formed through the socket between the top and bottom socket sides in a keyed socket aperture arrangement pattern selected to dispose the plurality of differently keyed setoff apertures about corresponding differently keyed standoffs projecting upward from a planar circuit board comprising the grid array pad connections so that the socket bottom side ball grid array connection surfaces are aligned with corresponding ones of the grid array pad connections; and
a ring of compressible resilient material located on a lower surface of the socket bottom planar side and surrounding the plurality of socket ball contacts;
wherein when retaining screws passing through a heatsink disposed above a central processing unit chip above the socket top side, and passing one each through the socket setoff apertures, are threaded one each into the planar board standoffs and tightened, the retaining screws bring the heatsink downward with compressive force against a top surface of the central processor unit chip which urges the central processor unit chip downward with the compressive force against the socket top side and results in electrically conductive connections of the chip electrical connections to the socket pins, the compressive force further received by the socket from the central processing unit chip and translated by the socket to urge the bottom side ball grid array connection surfaces into electrically conductive contact with the aligned circuit board socket pad connections and to compress the compressible resilient ring between the socket bottom lower surface and a planar upper surface of the planar circuit board that surrounds the planar pad grid array on the planar circuit board;
wherein the compressed ring resists the compression with resilient material forces projected against the socket bottom lower surface and the planar circuit board upper surface and thereby seals the surrounded electrically conductive contacts between the socket bottom side ball grid array connection surfaces and the aligned circuit board socket pad connections from dust and debris infiltration; and
wherein the retaining screws thereby mechanically maintain the electrically conductive contacts between the socket bottom side ball grid array connection surfaces and the aligned circuit board socket pad connections in a fixed assembly without requiring permanently affixing said connections together via solder or an adhesive.

18. The article of manufacture of claim 17, wherein the HDL design structure comprises a netlist.

19. The article of manufacture of claim 17, wherein the HDL design structure resides on storage medium as a data format used for the exchange of layout data of integrated circuits.

20. The article of manufacture of claim 17, wherein the HDL design structure resides in a programmable gate array.

\* \* \* \* \*